United States Patent [19]

Chiu

[11] Patent Number: 5,462,012
[45] Date of Patent: Oct. 31, 1995

[54] SUBSTRATES AND METHODS FOR GAS PHASE DEPOSITION OF SEMICONDUCTORS AND OTHER MATERIALS

[75] Inventor: Tien-Heng Chiu, Spotswood, N.J.

[73] Assignee: AT&T Corp., Murray Hill, N.J.

[21] Appl. No.: 346,444

[22] Filed: Nov. 29, 1994

[51] Int. Cl.$^6$ .................................................. C30B 23/04
[52] U.S. Cl. ............................... 117/85; 117/86; 117/106; 117/108
[58] Field of Search ................................ 117/85, 86, 108, 117/106, 923

[56] References Cited

U.S. PATENT DOCUMENTS

| | | | |
|---|---|---|---|
| 5,009,926 | 4/1991 | Fukuda | 427/557 |
| 5,213,985 | 5/1993 | Sandroff et al. | 117/85 |
| 5,318,801 | 6/1994 | Snail et al. | 427/248.1 |
| 5,387,309 | 2/1995 | Bobel et al. | 117/85 |

FOREIGN PATENT DOCUMENTS 62-290122  12/1987  Japan ........................... 117/85

OTHER PUBLICATIONS

*Epitaxial growth rate measurements during molecular beam epitaxy* A. J. Spring Thorpe, et al., J. Vac. Sci. Technol. B 8 (2), Mar./Apr. 1990, pp. 266–270.

*Chemical Beam Epitaxy of $Ga_{0.47}$ $In_{0.53}$ As/InP Quantum Wells and Heterostructure Devices,* W. T. Tsang, Journal of Crystal Growth 81 (1987), pp. 261–269.

*Primary Examiner*—Robert Kunemund

[57] ABSTRACT

A novel substrate for growth of material by chemical phase deposition includes a temperature monitoring zone formed by applying a coating of growth preventing material (e.g., $SiO_x$ or $SiN_x$) to a portion of the substrate. The temperature of the substrate can be monitored during growth of a desired material using an optical pyrometer having its field of view directed at the temperature monitoring zone.

9 Claims, 4 Drawing Sheets

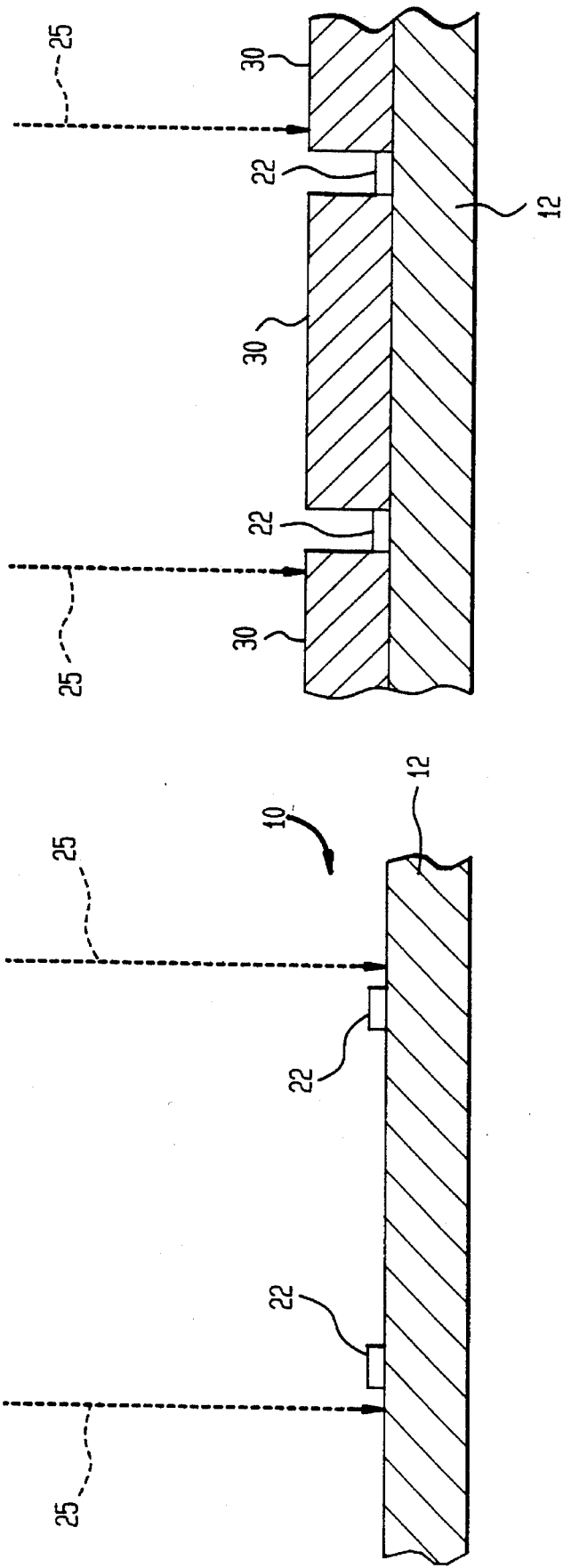

SUBSTRATES AND METHODS FOR GAS PHASE DEPOSITION OF SEMICONDUCTORS AND OTHER MATERIALS

BACKGROUND

1. Technical Field

This disclosure relates to novel substrates for the growth of materials by gas phase deposition technologies. More specifically, this disclosure relates to a substrate for growth of materials by gas phase deposition, the substrate having a temperature monitoring zone provided thereon and the use of non-contact optical pyrometry to measure the temperature of the substrate during growth of the material on the substrate. The materials and methods disclosed herein are particularly useful in monitoring the temperature of a substrate during the growth of semiconductors by gas phase deposition.

2. Background of Related Art

The growth of high quality semiconductors by gas phase deposition technology including chemical beam epitaxy (CBE) and metal organic chemical vapor deposition (MOCVD) depends strongly on the growth temperature. Therefore, active control of the substrate temperature throughout the growth process is very important for gas phase growth methods.

One method for substrate temperature monitoring is to use a thermocouple positioned at the backside of the substrate holder. However, this method does not provide the actual substrate surface temperature which may change during the growth process because of a change in the overall thermal radiation loss.

Non-contact optical pyrometry is sometimes used to determine the surface temperature of the substrate. The pyrometer is positioned to view a portion of the substrate and temperature readings are obtained throughout the growth process. Since the pyrometer views areas of the substrate where growth is occurring, a major disadvantage of this method is the presence of an interference effect produced during growth, particularly when the growth involves heterostructures. For example, during growth of an epitaxial layer having an optical constant which is different from that of the substrate material, the infrared radiation emitting through the epitaxial layer will undergo an apparent oscillation (ref) if the epilayer thickness is comparable to the optical wavelength at which the pyrometer functions. Unfortunately, the optical sensor of many pyrometers designed for such an application often operates at a wavelength of about 1 μm which is comparable to a typical epilayer thickness. Thus, due to interference effects the pyrometer readout will shown an oscillatory behavior with respect to growth time even though a constant temperature is measured by a thermocouple positioned at the back side of the wafer. If the pyrometer readout is used for feedback control to maintain a constant optical temperature, some variation in true temperature is expected, especially when the epilayer thickness is comparable to the operating wavelength of the pyrometer. These temperature variations produce an undesirable variation in the quality and properties of the resulting semiconductors.

It would be desirable to be able to accurately monitor the temperature of the substrate during gas phase deposition of materials such as, for example, during semiconductor growth.

SUMMARY

It has now been found that a substrate having a temperature monitoring zone provided thereon allows for accurate measurement of the substrate during growth of materials on the substrate by gas phase deposition techniques. The temperature monitoring zone is provided on the substrate by the application of a growth-preventing material to an area of the substrate. When semiconductor material is being added to a substrate in accordance with this disclosure, preferred growth-preventing materials are $SiO_x$ and $SiN_x$. When the temperature of the substrate is measured by non-contact optical pyrometry, the area of the temperature monitoring zone is preferably at least 0.70 times the area of the substrate viewed by the pyrometer.

In another aspect, a novel method has been discovered for monitoring the temperature of the substrate on which materials are grown using gas phase deposition. The method includes the steps of: a) is providing a temperature monitoring zone on a substrate by applying a growth-preventing material to the substrate; b) growing a desired material on the substrate by gas phase deposition; and c) monitoring the temperature of the substrate at the temperature monitoring zone while material is grown on the substrate.

BRIEF DESCRIPTION OF THE DRAWINGS

Various embodiments are described herein with reference to the drawings, wherein:

FIGS. 5–7 are views similar to FIGS. 2–4, respectively, showing a prior art substrate.

DETAILED DESCRIPTION OF PREFERRED EMBODIMENTS

While the following discussion is in terms of the growth of semiconductors on a wafer, it should be understood that the techniques disclosed herein apply to the growth of any materials by gas phase deposition on a substrate.

Figure 1:
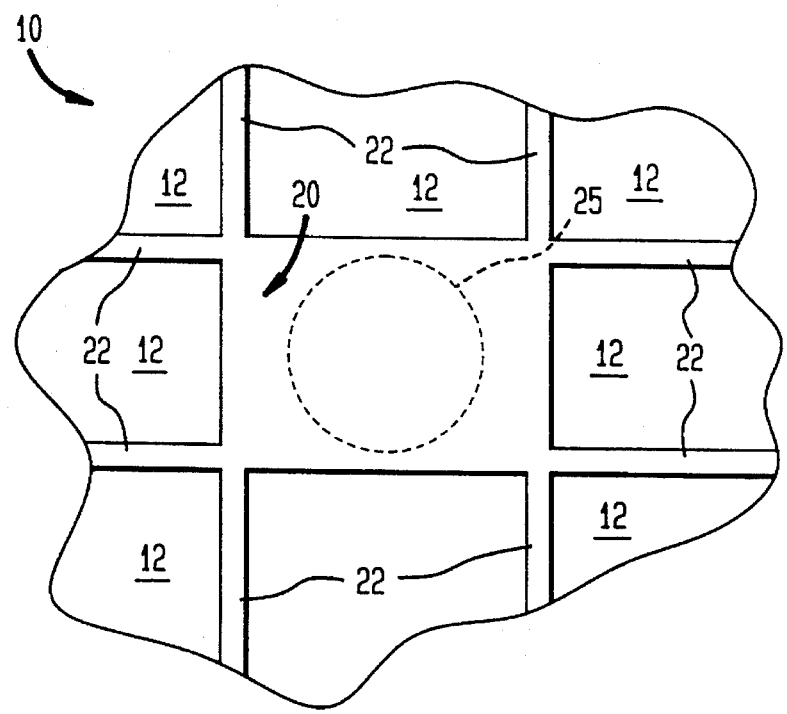
FIG. 1 is a partial schematic top view of a substrate in accordance with this disclosure.

Referring to FIG. 1, a portion of a substrate for semiconductor growth is shown and is generally denoted by the numeral 10. The substrate 10 includes a temperature monitoring zone 20 formed by applying a layer of growth-preventing material to a conventional wafer 12 of the type commonly used for semiconductor growth such as, for example, a GaAs wafer.

The growth-preventing material applied to wafer 12 to form temperature monitoring zone 20 can be any material which is capable of coating the wafer 12, capable of preventing growth of the semiconductor, and capable of withstanding the conditions employed in growing the semiconductor. Suitable materials include silicon oxides ($SiO_x$) and silicon nitrides ($SiN_x$). Such materials are presently used to provide a grid of thin lines of non-growth to separate individual semiconductors which are grown simultaneously on a single wafer. It is contemplated that the growth-preventing material can be used to form both semiconductor separating lines 22 as well as the temperature monitoring zone 20.

The growth-preventing materials can be applied to the wafer using known photolithographic techniques. For example, the wafer 12 is masked to leave the pattern of lines 22 and temperature monitoring zone 20. The layer of growth-preventing material is then applied to the masked wafer, for example by sputter coating. When the masking material is selectively removed from the wafer (e.g., by etching), the desired pattern of growth preventing material remains on the wafer.

The layer of growth-preventing material is applied to a thickness sufficient to prevent growth. However, if too thick a layer is applied, the layer of growth-preventing material will have a tendency to peel off the wafer. Generally, a thickness between about 500 Å and about 1 µm is suitable. Preferably, the thickness of the growth-preventing material is between about 1,000 Å and 5,000 Å.

Figure 2:
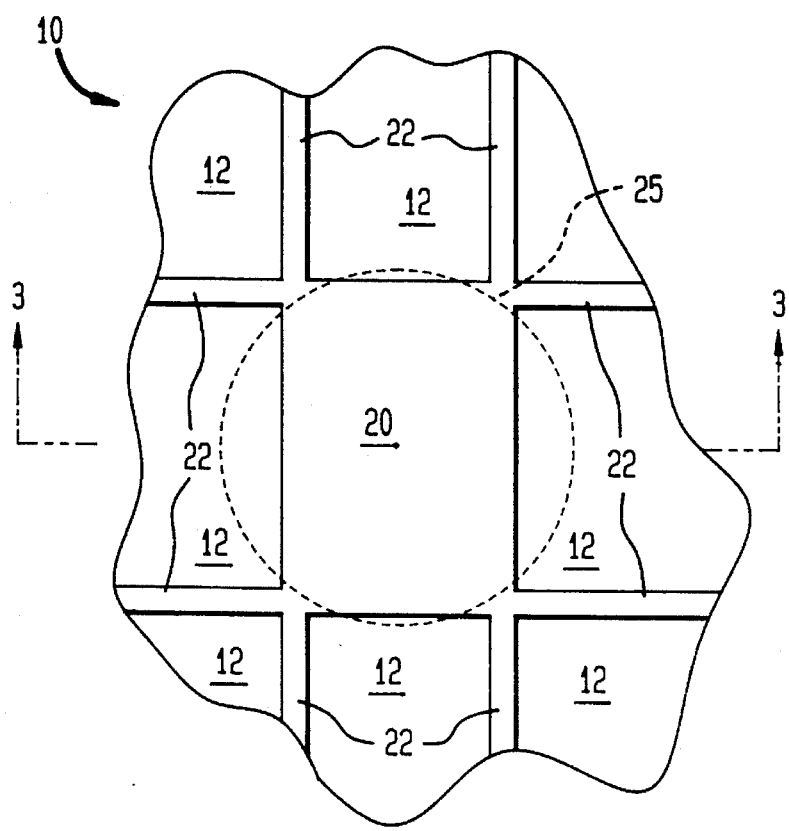
FIG. 2 is a partial schematic top view of another embodiment of a substrate in accordance with this disclosure.
Figure 4:
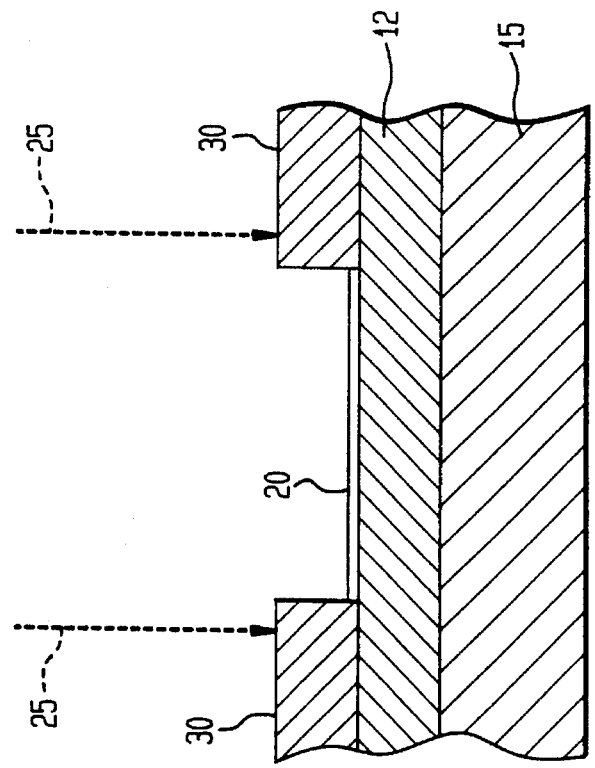
FIG. 4 is a view similar to FIG. 3 after material has been grown on the substrate.
Figure 3:
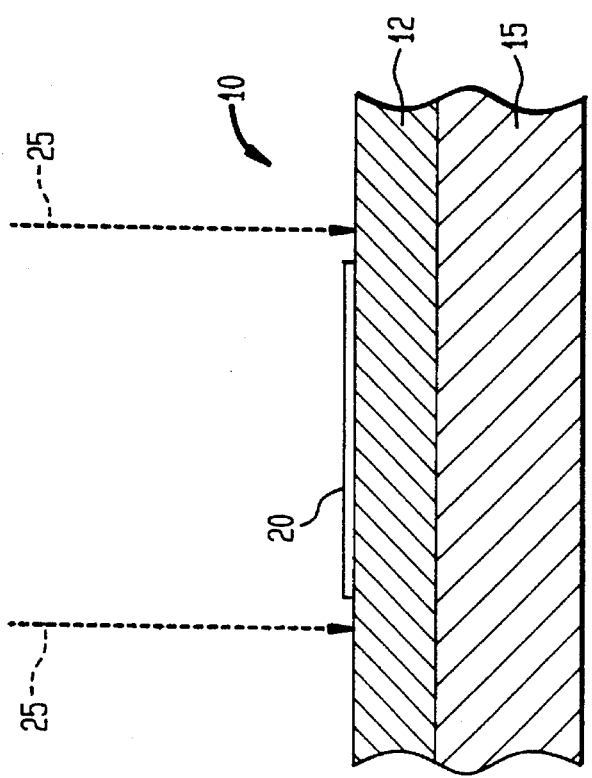
FIG. 3 is a partial schematic cross-sectional view along line 3—3 in FIG. 2.

The size of the temperature monitoring zone 20 will depend on the measurement technique employed. A preferred temperature measuring method is noncontact optical pyrometry. Optical pyrometers are a known type of temperature measuring device which measure the radiation emitted by a sample by viewing a spot on the sample. The spot (denoted by the numeral 25 and dashed lines in the figures) on the sample viewed by the pyrometer normally has a diameter between about 2.5 mm and about 1 cm. When an optical pyrometer is used as the temperature measuring device, the temperature monitoring zone formed on the wafer is preferably at least about 0.7 times the size of the spot viewed by the pyrometer. Preferably, the size of the temperature monitoring zone from about 0.8 to 1.25 times the size of the spot on the sample viewed by the pyrometer. Thus, as seen in FIG. 1, the temperature monitoring zone 20 may be larger than the spot 25 viewed by the pyrometer. Alternatively, as seen in FIGS. 2 through 4, the temperature monitoring zone 20 may be somewhat smaller than the spot 25 viewed by the pyrometer. For presently available pyrometers, the area of the temperature monitoring zone 20 can be about 3 mm$^2$ or greater. Preferably, the area of the temperature monitoring zone is from about 4 mm$^2$ to about 20 mm$^2$ and more preferably from about 5 mm$^2$ to 7 mm$^2$. It is also preferable for the temperature monitoring zone to be at least about 1.75 mm long in at least one direction.

There is, of course, a tradeoff in the accuracy of the reading and the relative sizes of the spot viewed by the pyrometer and the temperature monitoring zone. The previously discussed interference effect will adversely effect the measurements made by the pyrometer if the temperature monitoring zone is smaller than the spot viewed by the pyrometer due to the overlap of the spot with the growing semiconductor. Accordingly, it would be advantageous for the temperature monitoring zone to be larger than the spot viewed by the pyrometer. On the other hand, in providing a temperature monitoring zone, a portion of the wafer which could otherwise be used to grow semiconductors is being sacrificed. From the viewpoint of productivity, therefore, it would be advantageous to minimize the size of the temperature monitoring zone. It has been discovered that adequately accurate temperature measurements can be achieved when the temperature monitoring zone is at least 0.7 times the size of the spot viewed by the pyrometer. Thus, while the embodiment shown in FIG. 1 may provide the most accurate temperature measurements, for reasons of economy the embodiments shown in FIG. 2 may be preferred.

Figure 5:
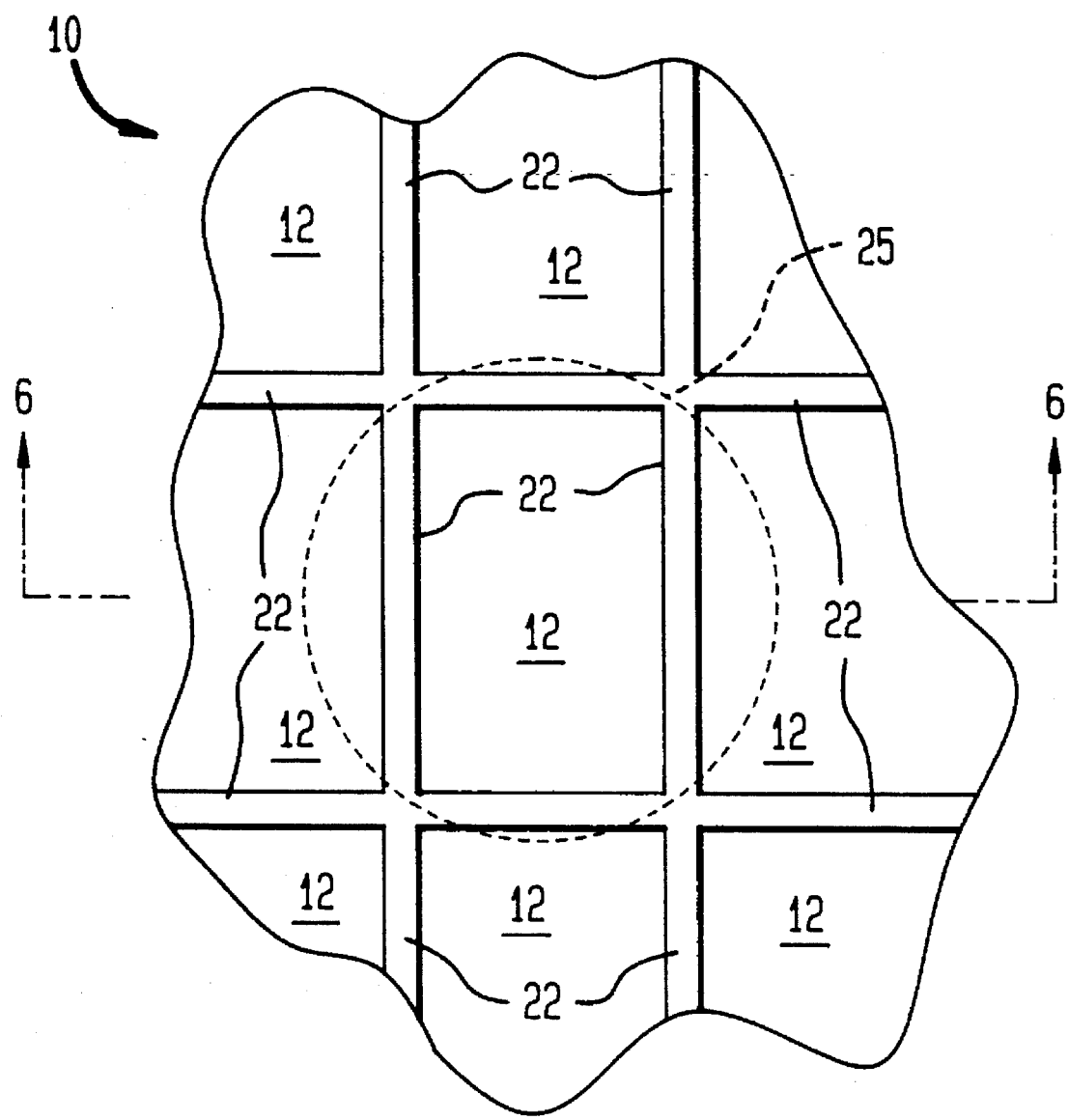

Despite the fact that the spot 25 viewed by the pyrometer can extend up to 30 percent beyond the area of the temperature monitoring zone 20, in the embodiment of FIG. 2, adequately accurate temperature measurements can be obtained. As shown in FIG. 3, the spot on the substrate which is viewed by the pyrometer, i.e., the area on the substrate 10 between dashed lines 25, extends beyond temperature monitoring zone 20. Thus, as the semiconductors 30 are grown as shown in FIG. 4, the majority of the area viewed by the pyrometer is temperature monitoring zone 20 with a relatively small fraction of the semiconductors 30 also being viewed. Since growth is occurring in only a relatively small fraction of the spot viewed by the pyrometer, the oscillatory reading normally produced by interference effects is minimized. In contrast, previously methods of the prior art (shown in FIGS. 5–7) provide no temperature monitoring zone. Accordingly, the only non-growth areas within the view of the pyrometer are the thin lines 22 separating the individual semiconductors 30 being grown on the wafer 12. As shown in FIG. 6, before any growth occurs, the temperature of the substrate can be accurately measured, since a large portion of wafer 12 is directly viewed by the pyrometer. However, once semiconductors 30 are grown on the substrate 10 as shown in FIG. 7, most of the area viewed by the pyrometer (i.e., the area between dashed lines 25) is undergoing growth. Accordingly, interference effects produced by the growing semiconductors 30 cause oscillatory readings on the pyrometer, thereby preventing consistently accurate measurements of the substrate's temperature.

The location of the temperature monitoring zone on the wafer is not critical. It is preferred to locate the temperature monitoring zone at the center of the wafer. This allows the temperature of the substrate to be monitored continually, if desired, by viewing a spatially stationary spot on the wafer, even as the wafer rotates during semiconductor growth. It is contemplated, however, that the temperature monitoring zone can be located elsewhere on the wafer provided that operation of the pyrometer can be synchronized with the rotation of the wafer, e.g., to operate intermittently only when the temperature monitoring zone rotates into the view of the pyrometer. Alternatively, a plurality of pyrometers located along the path of the rotating temperature monitoring zone or a pyrometer in synchronous rotation with the temperature monitoring zone can be used.

Normally, the substrate 10 is heated to desired temperatures by placement on a heating platform 15 (see FIGS. 3 and 4). In an alternate embodiment, rather than sacrificing an area on a wafer substrate on which semiconductors are to be grown, a small piece of wafer coated with growth-preventing material can serve as the temperature monitoring zone. The small, coated wafer can be placed on the heating platform adjacent to the main substrate. The pyrometer can then be positioned to view the small, coated piece of wafer which will be at the same temperature as the main substrate by virtue of the fact that they are made of the same material and are positioned on the same heating platform. Thus, monitoring the temperature of the small wafer will provide an accurate measurement of the temperature of the main substrate without the undesirable oscillatory readings due to interference effects that would be encountered if the temperature of the main substrate was measured directly by optical pyrometry during growth.

Any known gas phase deposition technique can be employed to grow the semiconductors on the substrate. Preferred methods of growth are gas phase deposition techniques, including chemical beam epitaxy (CBE) and metal organic chemical vapor deposition (MOCVD). Techniques for chemical beam epitaxy are known and are disclosed, for example, in "Chemical Beam Epitaxy of Ga$_{0.47}$In$_{0.53}$As/In P Quantum Wells and Heterostructure Devices" by W. T. Tsang, Journal of Crystal Growth, 81 (1987), pp. 261–269, the disclosure of which is incorporated herein by reference.

The term "semiconductor" as it is used herein is intended to include all III-V semiconductor materials. The material grown on the substrate using a gas phase deposition technique is not limited however to semiconductors, but rather the material grown on the substrate can be any vapor phase depositable material for which a growth preventing material can be identified. The present method and materials are particularly useful when the semiconductor being grown includes a heterostructure. Such semiconductors include, for example, multiple quantum wells, double heterostructure optoelectronic switch, vertical-to-surface transmission electrophotonic devices, heterojunction bipolar transistor and Bragg reflector.

It will be understood that various modifications may be made to the embodiments disclosed herein. For example, while the temperature monitoring zone is shown in the Figures as rectangular, it should be understood that other configurations are contemplated. Therefore, the above description should not be construed as limiting, but merely as exemplifications of preferred embodiments. Those skilled in art will envision other modifications within the scope and spirit of the claims appended hereto.

What is claimed is:

1. A process measuring the temperature of a substrate for semiconductor growth comprising:
   a) providing a substrate having a temperature monitoring zone of growth preventing material; and
   b) measuring the temperature of the substrate by viewing an area thereof using an optical pyrometer, the viewed area including at least a portion of the temperature monitoring zone.

2. A process as in claim 1, wherein the area of the temperature monitoring zone is at least about 0.7 times the size of the area viewed by the optical pyrometer.

3. A process as in claim 1, wherein the area viewed by the optical pyrometer is between about 5 and $mm^2$ and about 20 $mm^2$.

4. A process as in claim 1, further comprising the step of growing a semiconductor on the substrate.

5. A process as in claim 4, wherein the growing step comprises using a gas phase deposition technique to add material to the substrate.

6. A process as in claim 5, wherein the growing step comprises adding material to the substrate via chemical beam epitaxy.

7. A method of making semiconductors comprising:
   a) applying a coating of growth-preventing material to a portion of a substrate surface to provide a temperature monitoring zone;
   b) adding semiconductor material to the non-coated portion of the substrate via gas phase deposition; and
   c) measuring the temperature of the substrate surface during step (b) by positioning an optical pyrometer in a manner to view an area of the substrate of predetermined size,
      at least a portion of the temperature monitoring zone of the substrate being within the view of the pyrometer, the size of the coated area within the view of the pyrometer being at least 0.7 times the total size of the area of view of the pyrometer.

8. A method as in claim 7, wherein the temperature monitoring zone has an area of at least about 3 $mm^2$.

9. In a method for growing a material on a substrate using a gas phase deposition technique, the improvement comprising:
   providing a temperature monitoring zone on the substrate by applying a growth preventing material to the substrate; and
   measuring the temperature of the substrate while growing the material by viewing an area of the substrate using an optical pyrometer, the viewed area including at least a portion of the temperature monitoring zone.

* * * * *